(12) United States Patent
Miki et al.

(10) Patent No.: US 8,557,092 B2
(45) Date of Patent: Oct. 15, 2013

(54) SPUTTERING DEPOSITION APPARATUS AND BACKING PLATE FOR USE IN SPUTTERING DEPOSITION APPARATUS

(75) Inventors: Hisayuki Miki, Chiba (JP); Kenzo Hanawa, Ichihara (JP); Yasumasa Sasaki, Kamakura (JP)

(73) Assignee: Toyoda Gosei Co., Ltd., Aichi (JP)

( * ) Notice: Subject to any disclaimer, the term of this patent is extended or adjusted under 35 U.S.C. 154(b) by 709 days.

(21) Appl. No.: 12/374,974

(22) PCT Filed: Oct. 19, 2007

(86) PCT No.: PCT/JP2007/070428
§ 371 (c)(1),
(2), (4) Date: Jan. 23, 2009

(87) PCT Pub. No.: WO2008/047900
PCT Pub. Date: Apr. 24, 2008

(65) Prior Publication Data
US 2010/0006430 A1    Jan. 14, 2010

(30) Foreign Application Priority Data

Oct. 20, 2006 (JP) ................................. 2006-286243
Sep. 11, 2007 (JP) ................................. 2007-235282

(51) Int. Cl.
*C23C 14/56* (2006.01)
*C23C 14/06* (2006.01)
*C23C 14/34* (2006.01)

(52) U.S. Cl.
USPC .................................................... 204/298.13

(58) Field of Classification Search
USPC ........................................ 204/298.12–298.13
See application file for complete search history.

(56) References Cited

U.S. PATENT DOCUMENTS

| | | |
|---|---|---|
| 5,122,845 A | 6/1992 | Manabe et al. |
| 5,290,393 A | 3/1994 | Nakamura |
| 5,419,806 A * | 5/1995 | Huebner .......................... 216/20 |
| 6,713,789 B1 | 3/2004 | Shibata et al. |
| 2002/0078881 A1* | 6/2002 | Cuomo et al. ................... 117/84 |

(Continued)

FOREIGN PATENT DOCUMENTS

| | | |
|---|---|---|
| JP | 04-297023 A | 10/1992 |
| JP | 05-86646 B2 | 12/1993 |

(Continued)

OTHER PUBLICATIONS

Corundum definition—Academic Press Dictionary of Science and Technology, 1992, (http://www.credoreference.com/entry/apdst/corundum).*

(Continued)

*Primary Examiner* — Mark F Huff
*Assistant Examiner* — John S Ruggles
(74) *Attorney, Agent, or Firm* — Sughrue Mion, PLLC

(57) ABSTRACT

A backing plate for use in a sputtering deposition apparatus being capable of stably holding Ga, and a sputtering deposition apparatus which is equipped with the backing plate are provided. Such a backing plate for use in a sputtering deposition apparatus is a backing plate for holding a target material which contains Ga, and at least a contact surface of which coming into contact with the target material is constituted from an easily wettable material having a contact angle to Ga in a liquid state of not more than 90°.

8 Claims, 5 Drawing Sheets

(56) References Cited

U.S. PATENT DOCUMENTS

2002/0108847 A1* 8/2002 Cuomo et al. ........... 204/192.12
2008/0282967 A1* 11/2008 Einav ................................ 117/1
2009/0078564 A1* 3/2009 Ishibashi et al. ......... 204/298.13

FOREIGN PATENT DOCUMENTS

| JP | 10-287972 A | 10/1998 |
|---|---|---|
| JP | 11-172424 A | 6/1999 |
| JP | 3026087 B2 | 1/2000 |
| JP | 2001-059169 A | 3/2001 |
| JP | 2002-241930 A | 8/2002 |
| JP | 3440873 B2 | 6/2003 |
| JP | 3700492 B2 | 7/2005 |
| JP | 2005-272894 A | 10/2005 |

OTHER PUBLICATIONS

Quartz definition—Academic Press Dictionary of Science and Technology, 1992, (http://www.credoreference.com/entry/apdst/quartz).*

Y. Ushiku et al., "21st century joint symposium of Science technology and human", 2003, p. 295, vol. 2.

T. Kikuma et al., "GaN films deposited by planar magnetron sputtering", Vacuum, 2002, pp. 233-237, vol. 66.

* cited by examiner

SPUTTERING DEPOSITION APPARATUS AND BACKING PLATE FOR USE IN SPUTTERING DEPOSITION APPARATUS

TECHNICAL FIELD

The present invention relates to a sputtering deposition apparatus which is used for producing a light emitting diode (LED), a laser diode (LD) and electrical devices, and a backing plate for use in a sputtering deposition apparatus.

Priority is claimed on Japanese Patent Application No. 2006-286243, filed Oct. 20, 2006 and Japanese Patent Application No. 2007-235282, filed Sep. 11, 2007, and the contents of which are incorporated herein by reference.

BACKGROUND ART

Group III nitride compound semiconductors have been used for producing LEDs and LDs, because Group III nitride compound semiconductors have a band gap of direct transition type having energy corresponding to a domain ranging from visible light to ultraviolet rays and can efficiently emit light.

In addition, Group III nitride compound semiconductors have potential for use in an electronic devices, providing characteristics which cannot be obtained using conventional Group III to Group V compound semiconductors.

The following documents are considered:
[Patent Document 1]
The Japanese Patent Publication No. 3026087
[Patent Document 2]
Japanese Patent Laid-Open No. H04-297023
[Patent Document 3]
Japanese Patent Publication No. H05-86646
[Patent Document 4]
The Japanese Patent Publication No. 3440873
[Patent Document 5]
The Japanese Patent Publication No. 3700492
[Non-patent Document 1]
The 21st century alliance symposium memoirs, Vol. 2, p. 295 (2003)
[Non-patent Document 2]
Vacuum, Vol. 66, p. 233 (2002)

In general, Group III nitride compound semiconductors are produced using a metal organic chemical vapor deposition (MOCVD) method.

The MOCVD method uses trimethyl gallium, trimethyl aluminum and ammonia as raw materials, and adds the raw material in the form of vapor to a carrier gas to convey the resultant gas to the surface of a substrate, thereby decomposing the raw material through the reaction with the heated substrate to grow a crystal.

Although the MOCVD method has a merit of allowing fine control of film thickness and control of composition, it has a demerit in that the deposition takes longer and the control of the parameters is difficult.

Therefore, production of Group III nitride compound semiconductors using a sputtering method has been studied.

The sputtering method can increase the deposition rate, and allows simple and easy control of the parameters, thereby providing effects largely in the productivity of the device.

There is a report that a GaN layer can be deposited using a sputtering method to form a layer having an excellent smoothness (Non-patent Document 1 and Non-patent Document 2).

Non-patent Document 1 discloses that a GaN layer was deposited on Si(100) and sapphire (Al2O3)(0001) by a high-frequency magnetron sputtering using N2 gas.

As conditions for deposition, the total gas pressure was 2 mTorr, the applied electricity was 100 W, while the temperature of the substrate was changed from room temperature to 900° C. In accordance with the drawing shown in the monograph, the apparatus used there faced a target and a substrate to each other.

In addition, the Non-patent Document 2 discloses that a GaN layer was deposited using an apparatus in which a cathode and a taget were arranged to face to each other and in which a mesh was inserted between the substrate and the target.

As conditions for deposition, the pressure of the $N_2$ gas was set to 0.67 Pa, the temperature of the substrate ranged from 84 to 600° C., the applied electricity was 150 W, and the distance between the substrate and the target was 80 mm.

In addition, a study has been started in which a sputtering method and an MOCVD method have been used in the production of a laminated structure of a Group III nitride compound semiconductor using GaN to control an exact thickness and a resulting composition for producing a smooth deposition quickly and with no defects, thereby improving the speed of production.

Each of Patent Documents 1 and 2 disclose incorporating a buffer layer such as AlN in laminating GaN layer on a sapphire substrate to eliminate lattice incommensurate between GaN and sapphire layer, thereby increasing crystallinity of GaN.

In addition, it has been reported that an epitaxial growth can be performed by depositing a buffer layer using a high frequency sputtering method, and then growing a crystal having the same composition on the buffer layer using the MOCVD method (Patent Document 3).

It has been reported that the characteristics of the epitaxial growth can be improved by incorporating an annealing treatment of a buffer layer in the depositing process (Patent Document 4). In addition, it has been reported that the characteristics of the epitaxial growth can be improved by deposition of a buffer layer using a DC sputtering method (Patent Document 5) at a temperature of not less than 400° C.

Thus, the importance of a technique to deposit a Group III nitride compound semiconductors using a sputtering method has increased, and in particular, the importance of a technique to deposite GaN using a sputtering method has increased. However, since Ga is a liquid at normal temperature, until now it has been necessary to cool Ga to a solid state before sputtering deposition is performed when Ga is deposited as a target.

However, when the target is insufficiently cooled, or the power of plasma to be applied is increased, Ga suddenly changes from a solid state into a liquid state, and the deposition therefore may not be controllable.

Since a conventional backing plate had been produced on the assumption that Ga was used in a solid state, the wettability with Ga in a liquid state has not been considered.

When a material having poor wettability was used in the surface which comes into contact with Ga of a backing plate, heat did not escape from Ga to the backing plate, and as a result, the heat might melt Ga, or the cooling effect of the backing plate which was cooled down by a cooling agent did not conduct to Ga successfully, and as a result, the Ga might not be cooled down.

In such a case, the state of Ga suddenly changes from a solid into a liquid, thereby making the deposition control unstable.

In addition, when Ga was in a liquid state, Ga gathered into a droplet by surface tension, thereby exposing the surface of the backing plate.

As a result, a constitution element of backing plate surface was sputtered therewith.

Actually, when a sputtering was performed when the backing plate surface was exposed, and the resultant deposited product was analyzed, it revealed that an element which constitutes the backing plate was contained therein as a contaminant.

Accordingly, it is necessary to stably deposit a layer stably by uniformly performing thermal conduction between Ga and the backing plate whether Ga is in a liquid or solid state. In addition, when Ga is in a liquid state, it is necessary to form a Ga nitride compound semiconductor having no impurities by spreading Ga in a liquid state over the sputtering surface of the backing plate so as to deposit without exposing the surface of the backing plate.

DISCLOSURE OF THE INVENTION

The present invention was made in view of the above circumstances and it is an object of the present invention to provide a backing plate for use in a sputtering apparatus which is capable of stably holding Ga, and a sputtering apparatus which is equipped with the backing plate.

In order to attain the above object, the present invention adopts the following constitution.

(1) A first aspect of the present invention is a sputtering deposition apparatus including a backing plate for holding a target material containing Ga, in which the backing plate has at least a surface coming into contact with the target material which is constituted from an easily wettable material having a contact angle to Ga in a liquid state of not more than 90°.

(2) A second aspect of the present invention is the sputtering deposition apparatus as set forth in the first aspect, in which the easily wettable material is constituted from a material selected from the group consisting of silicon, carbon, silicon nitride, aluminum oxide and silicon oxide.

(3) A third aspect of the present invention is the sputtering deposition apparatus as set forth in the first or second aspect, in which the backing plate including the contact surface is wholly constituted of the easily wettable material.

(4) A fourth aspect of the present invention is the sputtering deposition apparatus as set forth in the third aspect, in which the target material is Ga in a liquid state.

(5) A fifth aspect of the present invention is the sputtering deposition apparatus as set forth in the first or second aspect, in which the contact surface is formed by coating the backing plate with the easily wettable material.

(6) A sixth aspect of the present invention is the sputtering deposition apparatus as set forth in the fifth aspect, in which the target material is Ga in a solid state or a liquid state.

(7) A seventh aspect of the present invention is the sputtering deposition apparatus as set forth in any one of the first to sixth aspects, which is used in depositing a layer consisting of a Group III nitride compound semiconductor including Ga on a substrate.

(8) An eighth aspect of the present invention is a backing plate for holding a target material containing Ga for use in a sputtering deposition apparatus, in which the backing plate has at least a surface coming into contact with the target material which is constituted of an easily wettable material having a contact angle to Ga in a liquid state of not more than 90°.

(9) A ninth aspect of the present invention is the backing plate for use in a sputtering deposition apparatus as set forth in the eighth aspect, in which the easily wettable material is a material selected from the group consisting of polysilicon, carbon and quartz.

(10) A tenth aspect of the present invention is the backing plate for use in a sputtering deposition apparatus as set forth in the eighth or ninth aspect, in which the backing plate including the contact surface is wholly constituted of the easily wettable material.

(11) An eleventh aspect of the present invention is the backing plate for use in a sputtering deposition apparatus as set forth in the eighth or ninth aspect, in which the contact surface is constituted by coating the backing plate with the easily wettable material thereon.

In accordance with the above constitution, the contact surface of the backing plate is formed of an easily wettable material having a contact angle to Ga in a liquid state of not more than 90°, hence Ga can be stably held without exposing the contact surface even if the Ga is in a liquid state.

BEST MODE FOR CARRYING OUT THE INVENTION

An explanation of one embodiment of the present invention will be given below.

Figure 1:
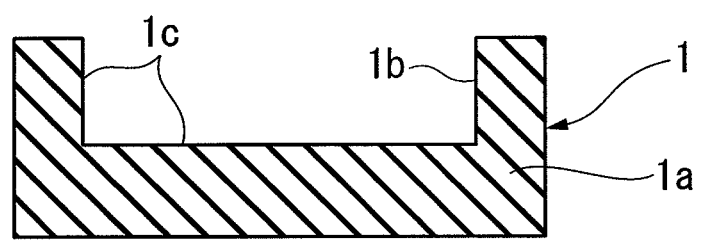
FIG. 1 is a sectional schematic view which shows an example of a backing plate of the present invention.

FIG. 1 is a sectional view which shows an example of a backing plate 1.

The backing plate 1 shown in FIG. 1 is constituted from a backing plate main body 1a consisting of an easily wettable material.

A reentrant 1b to hold a target material is formed in the backing plate main body 1a.

Internal 1c of this reentrant is considered to be a contact surface with target materials. With backing plate 1 shown in FIG. 1, the contact surface which is internal 1c of reentrant 1b is constructed using an easily wettable material by forming a main body of backing plate 1a from an easily wettable material.

Figure 2:
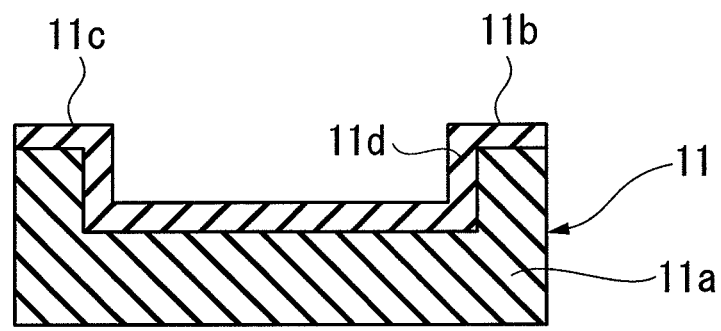
FIG. 2 is a sectional schematic view which shows another example of a backing plate of the present invention.

In FIG. 2, an example according to a thing of backing plate is shown.

A backing plate 11 shown in FIG. 2 includes a backing plate main body 11a and a coating layer 11b.

In an upper side 11c of the backing plate main body 11a, a reentrant 11d to hold the target material is formed.

In addition, a coating layer 11b is a thin film consisting of an easily wettable material and having a thickness of ranging from approximately 0.1 μm to 1 mm.

The coating layer 11b should be formed on the whole of the inner surface of the reentrant 11d, and may be formed on an upper surface 11c on the perimeter of the reentrant 11d.

In the backing plate 11 shown in FIG. 2, the surface of the coating layer 11b formed on the inner surface of the reentrant will serve as a contact surface with a target material.

The easily wettable material which includes the backing plate main body 1a shown in FIG. 1 or the coating layer 11b shown in FIG. 2 is a material of which contact angle to Ga in a liquid state becomes not more than 90°.

Here, "wettability" is a physical quantity which is univocally determined between a liquid and a solid surface, "wettability is high" refers to a phenomenon where a liquid spreads evenly over a surface of a solid, whereas "wettability is low" refers to a phenomenon where a liquid is repelled from a surface of a solid. The degree of "wettability" is in general defined by a contact angle $\theta$.

The contact angle $\theta$ means an angle on the side of liquid, which is formed between the surface of a liquid and the surface of a solid when a liquid droplet comes into contact with the surface of a solid or a liquid.

$\theta$ is associated with solid-vapour, liquid-vapour, and solid-liquid interface free energies ($\gamma sv$, $\gamma lv$, $\gamma sl$) by the Young's formula: $\gamma sv = \gamma lv \cos \theta + \gamma sl$.

When the contact angle $\theta = 180°$, it means that there is no wettability, as the value of $\theta$ decreases, wettablity increases, and when the value of $\theta = 0$, it means to become wett completely.

In the backing plates 1 and 11 of the present invention, the contact angle between Ga and the easily wettable material is preferably as small as possible, and more preferably not more than 90°.

Even more preferably, the contact angle is not more than 60°, and most preferably is not more than 30°.

Next, as an easily wettable material, silicon, carbon, silicon nitride, aluminum oxide and silicon oxide may be exemplary, and silicon and carbon are preferable.

In addition, when the easily wettable material is used as a backing plate per se. as shown in FIG. 1, it is preferable to use materials having hardness so as to be molded. The silicon may be either a single crystal or a polycrystal.

It is preferable to use a polycrystalline silicon from a cost perspective, however it is necessary to appropriately control the impurities contained therein. In addition, it is preferable to use materials having electrical conductivity.

This is the same in both cases when the backing plate per se. is formed with silicon as shown in FIG. 1, and when the backing plate made of the other material is coated with silicon as shown in FIG. 2.

When it is used as a coating material, polysilicon is realistic and preferable.

The carbon referred to here is preferably a graphite carbon, from a cost perspective, processability and electrical conductivity.

In this case, it is necessary to appropriately control the impurities contained therein.

In addition, as a coating, materials which are called diamond-like carbon (referred to as "DLC", hereafter) may be used.

Coating can be performed on the backing plate made of carbon.

The target material which are packed into the reentrants 1b and 11d of the backing plates 1 and 11 shown in FIG. 1 or 2 may be either Ga alone, or a mixture of Ga and other elements. As the other elements, those which are used as a dopant of GaN, such as Mg, Si and Al can be used. In addition, Ga may be used either as a liquid or a solid.

When other elements are added to Ga, and the target is used as a liquid, other elements are preferably completely dissolved into Ga to form a compound or alloy.

When other materials cannot be completely dissolved into Ga and the other materials in a solid state should be dispersed into Ga, a means for preventing the change in surface ratio between Ga and the other materials on the target surface even if sputtering is proceeded.

For example, some of the other elements are added as a solid, having a shape to exhibit the same cross-section area with respect to the direction of the depth of the target, so that the area ratio between Ga and the other elements will not vary even when the surface of the target is scraped by sputtering. In addition, the other elements shaped into granules may be dispersed uniformly within the target. The other elements may be used as a uniformly mixed mixture.

For example, when Mg, Al or In is added to Ga, Mg, Al or In may be dissolved into Ga, or these mixture may be solidified and then used, because the compatibility between Ga and Mg, Al or In is high.

In addition, when Si is added to Ga, Si may be shaped into granules or a powder and then dispersed into a Ga solid in a solid, since the compatibility between Ga and Si is low. This can be prepared by mixing granular Si with Ga in a liquid state, and then cooling and solidifying the resultant mixture. When Ga is used in a liquid state, it is preferable that a target consisting of Si is prepared separately, and simultaneous sputtering is performed.

A sputtering target which is used in a sputtering deposition apparatus is constructed by packing the above target material into the reentrant 1b and 11b of the backing plate 1 and 11, shown in FIG. 1 or 2.

Figure 3:
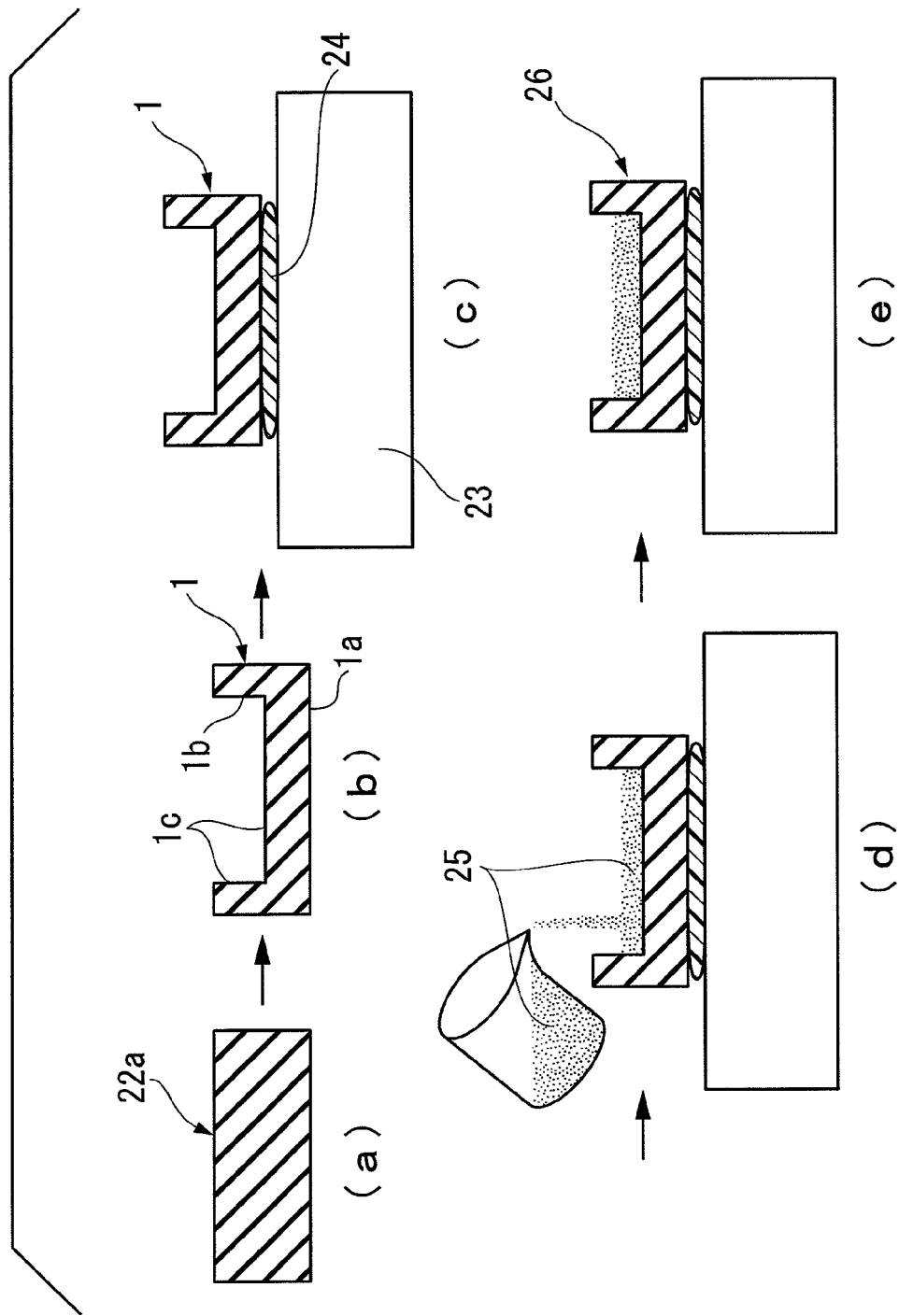
FIG. 3 (a)-FIG. 3 (e) are process diagrams explaining a production process of a sputter target using the backing plate shown in FIG. 1.

FIGS. 3(a) to 3(e) are figures of process to explain a production process of a sputter target 26 using the backing plate 1 shown in FIG. 1. At first, as shown in FIG. 3(a), a massive base material 22a consisting of an easily-wettable material is prepared. Next, as shown in FIG. 3(b), the base material 22a is subjected to shaping and processing to form a reentrant 1b. The shaping and processing of the reentrant 1b may be performed, for example, by grinding, press working. In this way, a backing plate 1 consisting of an easily-wettable material is produced. Thereafter, as shown in FIG. 3(c), the backing plate 1 is fixed onto a cooling plate 23, with intervening an adhesive 24 therebetween. After several Ga granules put into a beaker are heated to obtain liquid Ga, the resultant liquid the Ga is poured into the reentrant 1b of the backing plate 1, and cooled to room temperature, thereby solidifying Ga. Finally, a sputter target 26 shown in FIG. 3(e) is produced.

Figure 4:
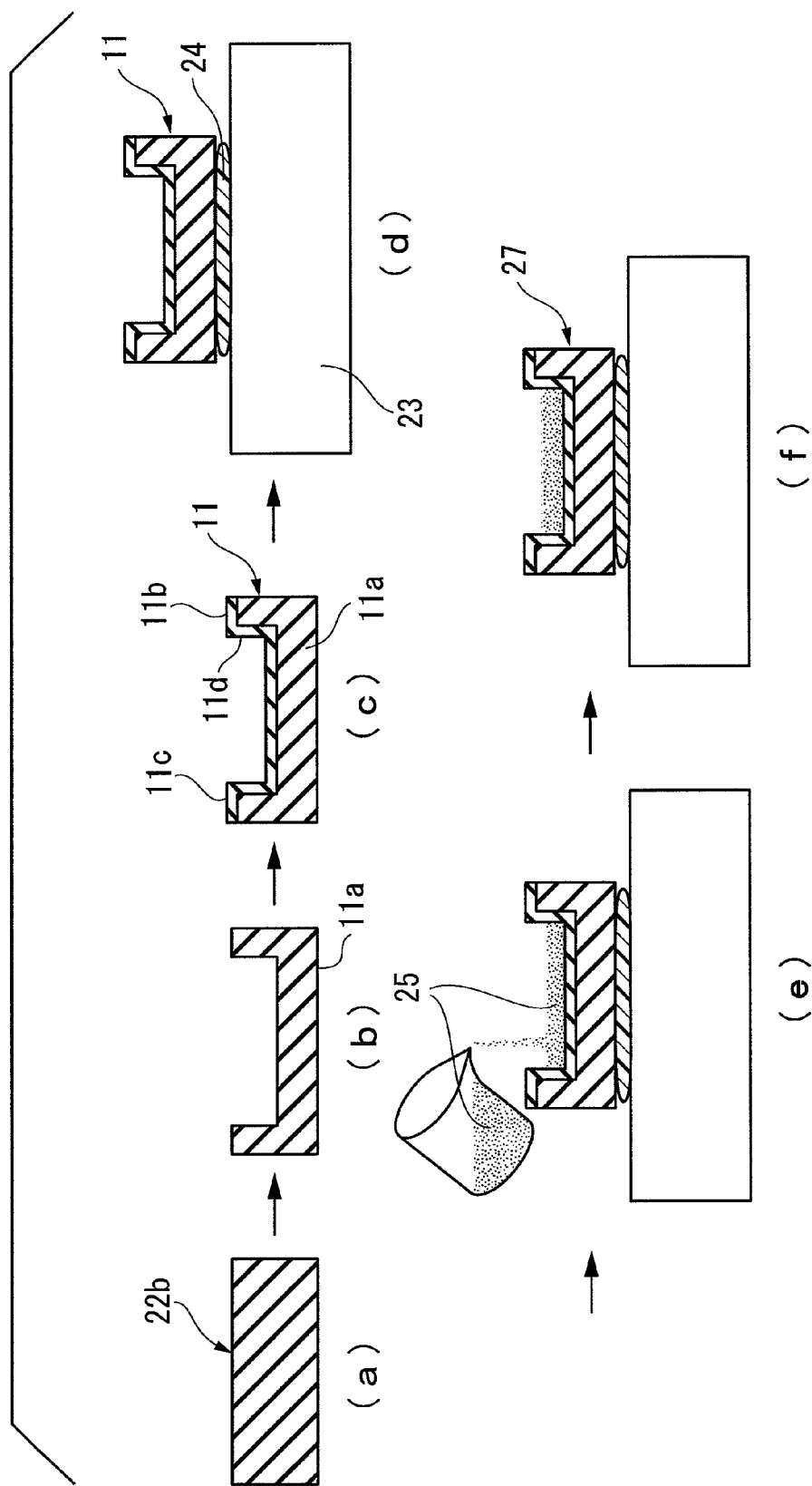
FIG. 4 (a)-FIG. 4 (f) are process diagrams explaining a production process of a sputter target using the backing plate shown in FIG. 2.

FIGS. 4(a) to 4(f) are figures of process to explain a production process of a sputter target 27 using the backing plate 11 shown in FIG. 2. At first, as shown in FIG. 4(a), a massive base material 22b is prepared. Next, as shown in FIG. 4(b), the base material 22b is subjected to shaping and processing to form a reentrant 11b. The shaping and processing of the reentrant 11b may be performed, for example, by grinding, press working. As shown in FIG. 4(c), the reentrant 11d and an upper surface 11c are coated with a coating material 11b. In this way, a backing plate 11 coated with an easily-wettable material is produced. In the process shown in FIGS. 4(d) to 4(d), the sputter target 27 shown in FIG. 4(f) is produced using a process similar to the process shown in FIGS. 3(c) to 3(e).

A method for coating which has been known generally can be used. For example, CVD, sputtering, vapor deposition, plating, and are exemplary. In particular, CVD is suitable for use in coating in the present invention, because CVD enables formation of a relatively dense layer over an object with a large size. A coating method which necessitates a reaction at a very high temperature cannot be applied, because the metal which forms a main body may melt.

In the backing plate 1 and 11, a contact surface is formed with an easily-wettable material which forms a contact angle of not more than 90°, and as a result, Ga can be spread uniformly and held without any opening and without exposing the contact surface, over the surface of the coating layer 11b which is formed to the inner surface 1c of the reentrant 1b or the inner surface of the reentrant 11d which serves as a contact surface with Ga, even when Ga is in a liquid state. As a result, there is no possibility that the easily-wettable material per se may be sputtered.

As shown in FIG. 1, when the backing plate 1 per se is constituted of an easily-wettable material, the easily-wettable material is scraped to expose new surface, even if the inner surface 1c on the reentrant 1b of the backing plate 1 is damaged by an impact or abrasion, and as a result, there is no influence on wettability with Ga. Ga can be spread uniformly and held without any opening over the inner surface 1c of the reentrant 1b which serves as a contact surface with Ga. It should be noted that many of the easily-wettable materials have low thermal conductivity, and hence Ga may be hardly maintained in a solid state at a low temperature. Accordingly, the sputter target 26 illustrated in FIGS. 3(a) to 3(e) is preferably used when liquid Ga is used as a target material.

On the other hand, as shown in FIG. 2, when the coating material 11b is applied to the backing plate as an easily-wettable material, only the surface of the backing plate can be coated with an easily-wettable material, while producing the main body of the backing plate 11a with a metal such as copper, aluminum, and steel, having excellent thermal conductivity, and as a result, the target material can be cooled efficiently by way of the main body of the backing plate 11a. Accordingly, the sputter target 27 illustrated in FIGS. 4(a) to 4(f) is preferably used when there is a possibility that solid Ga is used instead of liquid Ga as a target material.

In addition, if an easily-wettable material is used as the inner surface 1c of the reentrant 1b or the surface of the coating layer 11b formed on the inner surface of the reentrant 11d serving as a contact surface with Ga in the production step of the sputter target 26 and 27 shown in FIGS. 3(a) to 3(e) or FIGS. 4(a) to 4(f), then the backing plate 1, 11 which is capable of uniformly spreading and holding liquid Ga serving as a target material can be easily produced, without exposing the backing plate main body 1a or the surface of the coating layer 11b.

The coating may be constituted from a plurality of layers. For example, even if a coating material is compatible with Ga, when the coating material has poor compatibility with a backing plate material, there is a possibility that peeling of a coating layer may occur. In such a case, it is possible to form a layer therebetween, which consists of a material which is compatible to both materials. For example, when a carbon coating is coated to a plate made of copper, it is possible to insert a film made of polysilicon therebetween.

An explanation with respect to a sputtering deposition apparatus equipped with the above sputter target 26 and 27 will be given below.

Figure 5:
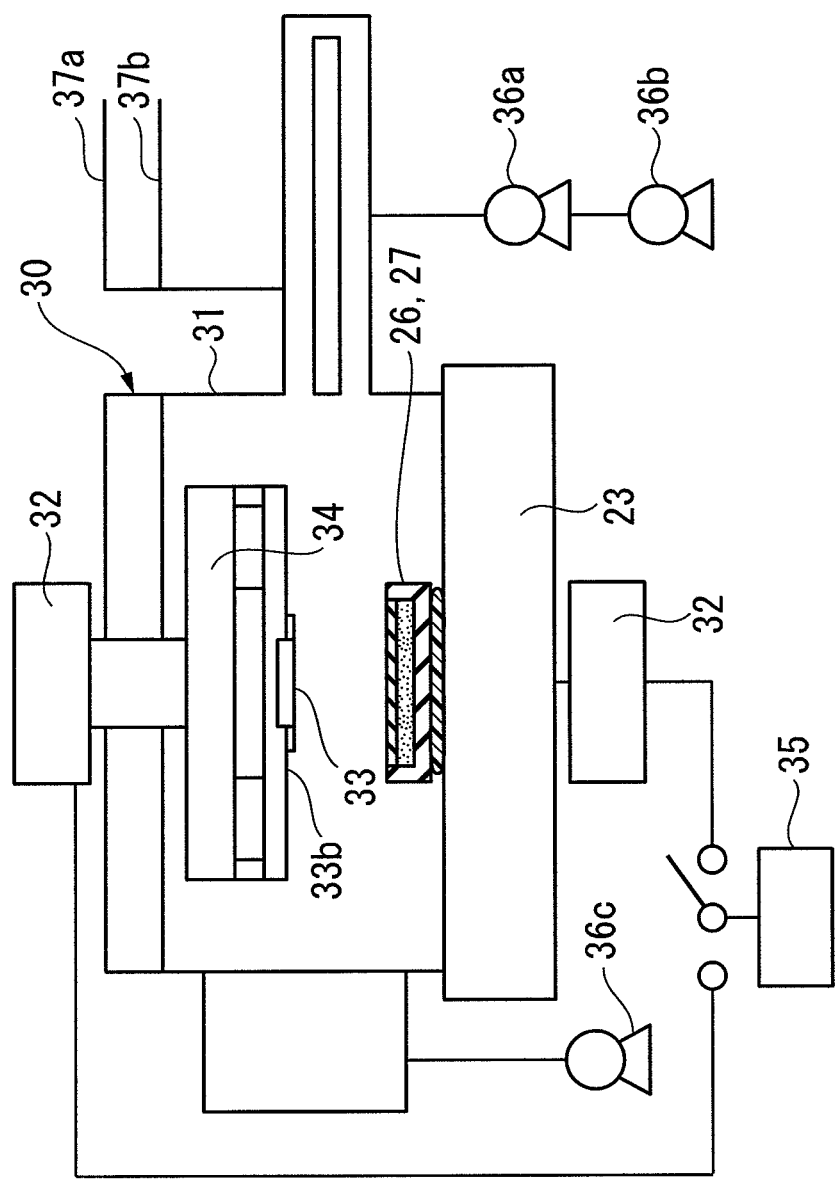
FIG. 5 is a schematic view showing an example of a sputtering deposition apparatus which is an embodiment of the present invention.

FIG. 5 is a schematic view showing an example of a sputtering deposition apparatus using the above sputter target 26 and 27. This sputtering deposition apparatus 30 is, as shown in FIG. 5, equipped with a chamber 31, the sputter target 26 and 27 disposed within the chamber 31, and a matching box 32 which applies power to the sputter target 26 and 27. In addition, as shown in FIG. 5, in the chamber 31 of the sputtering deposition apparatus 30, a mounting means 33b for mounting a substrate 33 downwardly opposed to the sputter target 26 and 27, a heater 34 for heating the substrate 33, a power supply 35 conductively connected to the matching box 32, pressure controlling means 36a, 36b, and 36c, including a pump to control the pressure inside the chamber 31, and gas supplying means 37a, 37b to supply gas into the chamber 31 are provided.

The Sputter target 26 and 27 are installed to a predetermined position in the chamber 31 of the sputtering deposition apparatus 30. When Ga is used as a solid target, the sputter target 26 and 27 are cooled by a cooling plate 23. The substrate 33 is carried in the chamber 31, and then mounted onto the sputter target 26 and 27. The interior of the chamber 31 is decompressed, and argon gas and nitrogen gas are introduced therein by the gas supplying means 37a and 37b. The substrate 33 is heated by the heater 34, and sputtering deposition is conducted by turning the power supply 35 on to control the matching box 32.

A sputtering involves an RF sputtering or a DC sputtering. For example, it is said that the deposition rate cannot be controlled unless an RF sputtering is used when a reactive sputtering is used, and as a result, it is preferable to use an RF sputtering, alternatively, to use a pulse DC sputtering which implies bias pulsatively. In addition, when an RF sputtering is used, it is preferable to displace the magnet position within a target, in order to improve uniformity of thickness of the layer. The method of displacement may be selected depending on the apparatus, swinging and revolving can be conducted.

An example of a production method of a Ga nitride compound semiconductor device which uses the above sputter deposition apparatus 30 will be explained below. In general, whatever material, which can deposit group III nitride compound semiconductor crystal, may be employed as the substrate 33 used for producing a Ga nitride compound semiconductor device. For example, sapphire, SiC, silicon, zinc oxide, magnesium oxide, manganese oxide, zirconia, manganese oxide zinc iron, magnesium oxide aluminum, zirconium borate, gallium oxide, indium oxide, lithia gallium, lithia aluminum, neodymium oxide gallium, lantern oxide strontium aluminum tantalum, strontium oxide titanium, titanium oxide, hafnium, tungsten and molybdenum are exemplary. In addition, since a sputtering method can generally keep the temperature of a substrate low, it is possible to deposit a layer onto a substrate without damaging the substrate even when the substrate is easily decomposable at a high temperature.

Generally known compounds can be employed as the nitrogen raw material used in this embodiment. In particularly, ammonia and nitrogen are preferable, because they are easy to handle and are available at a relatively low cost. Since ammonia excels in decomposition efficiency, deposition can be performed at a high growing rate, but the reactivity and toxicity of ammonia are high, and hence toxicity-removing equipment and gas detector are required, and various countermeasures such as converting of the material for reacting apparatus into a chemically stable material are necessary. On the contrary, as for the decomposition of nitrogen, a simple apparatus will suffice, but a high growing rate cannot be obtained. As for a method of introducing nitrogen into an apparatus after nitrogen has been decomposed by electrical field or heat, the growing rate thereof is a degree which can be used although it is inferior to the growing rate when ammonia is used, and hence the method above is the most preferable one in view of trade-off between the growing rate and the apparatus cost.

The temperature of the substrate during deposition preferably ranges from room temperature to 1200° C. At a temperature not higher than room temperature, migration on the substrate surface is suppressed, and as a result, group III nitride compound semiconductor crystals having excellent crystallinity are not formed. On the other hand, at a temperature not lower than 1200° C., a group III nitride compound semiconductor crystal decomposes. The temperature of the substrate during deposition more preferably ranges from 300 to 1000° C., and the most preferably ranges from 500 to 800° C.

In the production method of this embodiment, when a semiconductor layer is deposited using a sputtering method, the power applied to a sputter target preferably ranges from 0.1 W/cm² to 100 W/cm², more preferably ranges from 1 W/cm² to 50 W/cm², and the most preferably ranges from 1.5 W/cm² to 50 W/cm². By adjusting the power to be applied to the sputter target 26 and 27, a reaction specie having a large amount of power are formed, and the reaction specie can be supplied to the substrate with the use of a high kinetic energy, and as a result, migration on the substrate will be active, thereby allowing excellent crystal to be obtained. If an excessive amount of large power is introduced, then the surface temperature of the sputter target 26 and 27 increases to form a state in which solids and liquids are mixed. Performing a sputter under such a condition causes dust and sparks, and hence is not preferable.

Pressure in the chamber 31 is preferably not less than 0.3 Pa. If pressure is less than 0.3 Pa, then the existing amount of nitrogen is too small, then metal sputtered adheres without forming nitride. The upper limit of the pressure is not particularly limited, the pressure should be one which can generate plasma.

When a mixed crystal is required to be deposited using a sputtering method, a mixture of metal material (which may not constitute an alloy) may be prepared as a target. Alternatively, two pieces of target each of which consisting of different material are prepared and sputtered at the same time. In general, when a layer having a predetermined composition is deposited, a target made from a mixed material is used, whereas when several kinds of layers having composition different from each other are deposited, a plurality of targets are disposed within the chamber 31.

When a group III nitride to be deposited is not a GaN having a single composition, a layer having a desired composition can be deposited by sputtering a target in which elements other than Ga is mixed. In addition to Al or In which forms a mixed crystal with Ga, one or more of, for example, Mg, Zn, C, Si, Ge, and Sn may be added, which is doped into a crystal in order to control electrical conductivity. The additional amount can be calculated in view of the composition of the target crystal, doping amount, and sputtering rate. The mixed elements may be either a uniformly mixed mixture (an alloy or a compound) or a mixture containing ununiform composition.

Since the backing plate 1 and 11 is constituted by molding or coating an easily-wettable material, liquid Ga is uniformly spread over the target surface, without aggregating within a target, and as a result, the resultant deposited Ga nitride compound can be prevented from being contaminated by impurities derived therefrom.

A Ga nitride compound semiconductor device can also be produced by deposition using the backing plate in this embodiment.

The above Ga nitride compound semiconductor device is constituted by forming a group III nitride compound on the substrate through a sputtering method, laminating a semiconductor laminated structure having a function on the resultant layer to form various semiconductor devices. This Ga nitride compound semiconductor device can be applied to a photoelectric conversion element such as a laser device or, a light receiving element, and an electronic device such as HBT, or HEMT, in addition to a light-emitting device. Many of these Ga nitride compound semiconductor devices having various structures are known, and the device structure to be laminated on the group III nitride compound semiconductor laminated structure of the present invention are not limited, including the known well device structures.

The present invention will be specifically explained below, referring to embodiments. However, the present invention is not limited to only these embodiments.

EXAMPLE

Example 1

A backing plate made of a polysilicon as shown in FIG. 1 was produced by molding a base material made of a polysilicon.

Next, after the above backing plate was soaked into an organic solvent such as isopropyl alcohol (IPA) to be cleaned, the resultant backing plate was fixed to a cooling plate using an adhesive. Several Ga particles were put into a beaker, heated at 60° C. to melt them into a liquid, and thereafter the resultant liquid Ga was poured into the reentrant of the backing plate, and then cooled to a room temperature 25° C. at which clean room was set to solidify Ga, thereby producing a sputter target.

In addition, as shown in FIG. 5, this sputter target was installed to a predetermined position in a chamber of a sputter deposition apparatus, and a sapphire substrate was installed on an upper part thereof. In the sputter deposition apparatus, the sapphire substrate was heated to 500° C., nitrogen gas was introduced thereinto at a flow rate of 15 sccm, the pressure in the chamber was held at 1.0 Pa ($0.6 \times 10^{-3}$ Torr), and the substrate was cleaned with a high frequency plasma of 50 W. Next, the substrate temperature was maintained at 500° C., the backing plate was heated with a heater to make Ga in a liquid state, while introducing argon gas at a flow rate of 5 sccm and nitrogen gas at a flow rate of 15 sccm, and thereafter a high frequency having 1 W/cm² was applied to a Ga target, thereby forming a single layer film of GaN on the sapphire substrate. The resultant single layer film of GaN was taken out, and was subjected to Secondary Ion Mass Spectrometry (SIMS) analysis. Si concentration in the GaN layer was $5 \times 10^{16}$ atoms/cm³. This Si is derived from the constitution material of the backing plate, and it revealed that the detected concentration was not such an amount that affects on the film.

Example 2

A base material made of Cu was molded, and a carbon coating was performed by CVD method to produce a backing plate, as shown in FIG. 2, which is made of Cu and coated with carbon having a thickness of 200 μm.

Next, a sputter target was produced similarly to Example 1. In addition, the sputter target was cooled by a cooling plate, and a single layer film of GaN was formed on a sapphire substrate by the same way as in Example 1 with the exception of sputtering Ga in a solid state.

The resultant single layer film of GaN was taken out, and was subjected to SIMS analysis. As a result of examining whether Cu and C were detected as impurities, but it was lower than the detective level of SIMS.

Example 3

A base material made by $SiO_2$ is molded, and a backing plate made of $SiO_2$ as shown in FIG. 1, was produced.

Next, after the above backing plate was soaked into an organic solvent such as IPA to be cleaned, the resultant backing plate was fixed to a cooling plate using an adhesive. Several Ga particles were put into a beaker, heated at 60° C. to melt them into a liquid, and thereafter Al wire rods having a diameter of approximately 1 mm cut into a length of 2 to 3 cm were added thereto at a percentage of 8 g of Al per 1 kg of Ga and melted, and the resultant molten material was poured into the reentrant of the backing plate, and then cooled to a room temperature 25° C. at which clean room was set to solidify Ga Al, thereby producing a sputter target.

In addition, a single layer film of AlGaN was formed on the sapphire substrate in the same way as in Example 1.

The resultant single layer film of AlGaN was taken out, and was subjected to SIMS analysis. Si concentration in the AlGaN layer was $5 \times 10^{16}$ atoms/cm$^3$. This Si is derived from $SiO_2$ used as the material of the backing plate, and it revealed that the amount of concentration detected does not affect the film.

Example 4

A base material made of Cu was molded, and a carbon coating was performed using a CVD method to produce a backing plate, as shown in FIG. 2, which is made of Cu and coated with carbon to a thickness of 200 μm.

Next, after the above backing plate was soaked in an organic solvent such as IPA to be cleaned, the resultant backing plate was fixed to a cooling plate using an adhesive. Several Ga particles were put into a beaker, heated at 60° C. and melted into a liquid, and thereafter several particles of In were added thereto at a percentage of 164 g of In per 1 kg of Ga, and the resultant material was poured into the reentrant of the backing plate, and then cooled to a room temperature of 25° C. at which clean room was set to solidify GaIn, thereby producing a sputter target.

In addition, the sputter target was cooled in a cooling plate, and a single layer film of InGa was formed on a sapphire substrate by the same way as in Example 1 with the exception of sputtering GaIn in a solid state. The resultant single layer film of InGaN was taken out, and was subjected to SIMS analysis. As a result of the examination, Cu and C were detected as impurities, but it was lower than the detective level of SIMS.

Example 5

A base material made of carbon was molded to produce a backing plate made of carbon as shown in FIG. 1.

Next, after the above backing plate was soaked into an organic solvent such as IPA to be cleaned, the resultant backing plate was fixed to a cooling plate using an adhesive. Several Ga particles were put into a beaker, heated at 60° C. and melted into a liquid, and thereafter mass of Mg having a diameter of approximately 1 cm was added thereto at a percentage of 800 mg of Mg per 1 kg of Ga to be melted, and the resultant molten material was poured into the reentrant of the backing plate, and then cooled to a room temperature 25° C. at which clean room was set to solidify Ga Mg, thereby producing a sputter target.

In addition, a single layer film of GaN in which Mg was doped (referred to as GaN: Mg, hereinafter) was formed on a sapphire substrate by the same way as in Example 1. The resultant single layer film of GaN: Mg was taken out, and was subjected to SIMS analysis. As a result of examination, C was detected as an impurity, but it was lower than the detective level of SIMS.

Example 6

A base material made of Cu was molded, and a silicon coating was performed by CVD method to produce a backing plate, as shown in FIG. 2, which is made of Cu and coated with silicon to a thickness of 100 μm.

Next, after the above backing plate was soaked in an organic solvent such as IPA to be cleaned, the resultant backing plate was fixed to a cooling plate using an adhesive. Several Ga particles were put into a beaker, heated at 60° C. and melted into a liquid, and thereafter several particles of Si having a diameter of approximately 50 μm were added thereto at a percentage of 1260 mg of Si per 1 kg of Ga, and the resultant material was poured into the reentrant of the backing plate, and then cooled to a room temperature of 25° C. at which clean room was set to solidify Ga Si, thereby producing a sputter target.

In addition, the sputter target was cooled by a cooling plate, and a single layer film of GaN in which Mg was doped (referred to as GaN: Si, hereinafter) was formed on a sapphire substrate by the same way as in Example 1, with the exception of sputtering GaSi in a solid state. The resultant single layer film of GaN: Si was taken out, and was subjected to SIMS analysis. Si concentration in the GaN: Si film was $5 \times 10^{18}$ atoms/cm$^3$. A suitable value of Si added as a dopant was obtained.

Example 7

A backing plate made of a polysilicon was produced in a way similar to Example 1.

Next, after the above backing plate was soaked in an organic solvent such as IPA to be cleaned, the resultant backing plate was fixed to a cooling plate using an adhesive. Several Ga particles were put into a beaker, heated at 60° C. and melted into a liquid, and thereafter Al wire rods having a diameter of approximately 1 mm cut into a length of 2 to 3 cm were added thereto, and then a mass of Mg having a diameter of approximately 1 cm was added to the resultant mixture at a percentage of 800 mg of Mg per 1 kg of Ga and melted, and the resultant molten material was poured into the reentrant of the backing plate, and then cooled to a room temperature of 25° C. at which clean room was set to solidify GaAlMg, thereby producing a sputter target.

In addition, a single layer film of AlGaN in which Mg was doped (referred to as AlGaN: Mg, hereinafter) was formed on a sapphire substrate by the same way as in Example 1. The resultant single layer film of AlGaN: Mg was taken out, and was subjected to SIMS analysis. The Si concentration in the AlGaN: Mg film was $5 \times 10^{16}$ atoms/cm$^3$. Although an element of polysilicon used as a backing plate material was detected as an impurity, it was revealed that the amount was a level so as not to affect on the film.

Example 8

A base material made of Cu was molded to produce a backing plate which is made of Cu. A base material made by Cu is molded, a backing plate made of Cu was produced.

Next, after the above backing plate was soaked in an organic solvent such as IPA to be cleaned, the resultant backing plate was fixed to a cooling plate using an adhesive. Several Ga particles were put into a beaker, heated at 60° C. and melted into a liquid, and thereafter a small amount of In was added thereto to be melted, and then granular Si having a diameter of approximately 50 μm at a percentage of 1260 mg of Si per 1 kg of Ga, and the resultant material was poured into the reentrant of the backing plate, and then cooled to a room temperature of 25° C. at which a clean room was set to solidify GaInSi, thereby producing a sputter target.

In addition, the sputter target was cooled by a cooling plate, and a single layer film of InGaN: Si in which Si was doped (referred to as InGaN: Si, hereinafter) was formed on a sapphire substrate by the same way as in Example 1, with the exception of sputtering GaInSi in a solid state. The resultant single layer film of InGaN: Si was taken out, and was subjected to SIMS analysis. The detected element was Si and the concentration of Si was $5 \times 10^{17}$ atoms/cm$^3$. A suitable value of Si added as a dopant was obtained.

Example 9

A base material made of Cu was molded, and a silicon nitride coating was performed by CVD method to produce a backing plate, as shown in FIG. 2, which is made of Cu and coated with silicon nitride having a thickness of 200 μm.

Next, after the above backing plate was soaked into an organic solvent such as IPA to be cleaned, the resultant backing plate was fixed to a cooling plate using an adhesive. Several Ga particles were put into a beaker, heated at 60° C. and melted into a liquid, and the resultant material was poured into the reentrant of the backing plate, and then cooled to the room temperature 25° C. at which clean room was set to produce a sputter target.

In addition, the sputter target was cooled by a cooling plate, and a single layer film of GaN was formed on a sapphire substrate by the same way as in Example 1 with the exception of sputtering Ga in a solid state. The resultant single layer film of GaN was taken out, and was subjected to SIMS analysis. As a result of examination, Cu and Si were detected as impurities, but it was lower than the detective level of SIMS.

Comparative Example 1

A base material made of Cu was molded to produce a backing plate made of Cu.

Next, a sputter target was produced similarly to Example 1.

In addition, a single layer film of GaN was formed on a sapphire substrate in a way similar to Example 1 The resultant single layer film of GaN was taken out, and was subjected to SIMS analysis. The element most detected as impurities was Cu, and the amount thereof was $1 \times 10^{18}$ atoms/cm$^3$. Cu used as the material for backing plate was contained as an impurity in the film. It was found that the method used in Comparative Example 1 cannot be practically used, since the amount was enough to affect the film characteristics.

Comparative Example 2

A base material made of Cu was molded to produce a backing plate made of Cu.

Next, a sputter target was produced similarly to Example 1, with the exception of washing the backing plate soaking in HCl.

In addition, a sputter target was cooled by a cooling plate to form a single layer film on a sapphire substrate, in the same way as in Example 1, with the exception of sputtering Ga in a solid state. The resultant single layer film of GaN was taken out, and was subjected to SIMS analysis. Cu concentration in the GaN film was $1 \times 10^{15}$ atoms/cm$^3$. Although Cu used as a backing plate material was detected as an impurity, it was revealed that the amount detected had no affection on the film. The above-mentioned result is shown in Table 1.

TABLE 1

| | Deposited material | State of Ga | Mixed material | Backing Plate Material | Coating | Surface treatment | SIMS result |
|---|---|---|---|---|---|---|---|
| Example 1 | GaN | Liquid | none | Polysilicon | None | Cleaned with organic solvent | Si: $5 \times 10^{16}$ |
| Example 2 | GaN | Solid | none | Cu | Carbon | Cleaned with organic solvent | Cu: minimum limit of detection C: minimum limit of detection |
| Example 3 | AlGaN | Liquid | Al(melt) | SiO$_2$ | None | Cleaned with organic solvent | Si: $5 \times 10^{16}$ |
| Example 4 | InGaN | Solid | In(grain) | Cu | Carbon | Cleaned with organic solvent | Cu: minimum limit of detection C: minimum limit of detection |
| Example 5 | GaN: Mg | Liquid | Mg(melt) | Carbon | None | Cleaned with organic solvent | C: minimum limit of detection |
| Example 6 | GaN: Si | Solid | Si(grain) | Cu | Silicon | Cleaned with organic solvent | Si: $5 \times 10^{18}$ |
| Example 7 | AlGaN: Mg | Solid | Al(melt) Mg(grain) | Polysilicon | None | Cleaned with organic solvent | Si: $5 \times 10^{16}$ |

TABLE 1-continued

| | Deposited material | State of Ga | Mixed material | Backing Plate Material | Coating | Surface treatment | SIMS result |
|---|---|---|---|---|---|---|---|
| Example 8 | InGaN: Mg | Solid | In(dissolved) Si(grain) | Cu | Silicon | Cleaned with organic solvent | Si: $5 \times 10^{17}$ |
| Example 9 | GaN | Solid | None | Cu | Silicon nitride | Cleaned with organic solvent | Cu: minimum limit of detection Si: minimum limit of detection |
| Comparative Example 1 | GaN | Liquid | none | Cu | None | Cleaned with organic solvent | Cu: $1 \times 10^{18}$ |
| Comparative Example 2 | GaN | Solid | none | Cu | None | Cleaned with HCl | Cu: $1 \times 10^{15}$ |

Figure 6A:
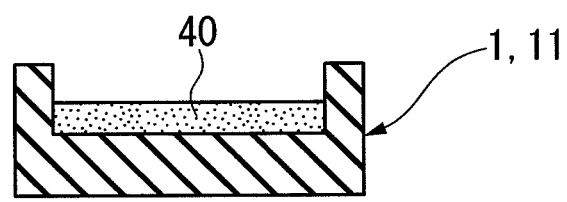
FIG. 6A is a sectional schematic view of the sputter target of Examples 1, 3, 5 and 7.
Figure 6B:
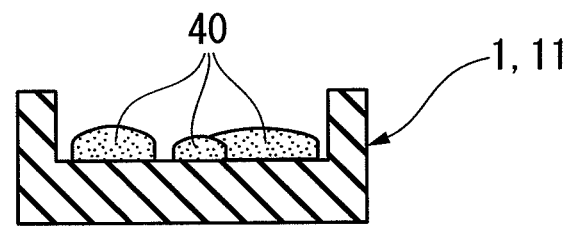
FIG. 6B is a sectional schematic view of the sputter target of Comparative Examples 1 and 2.

It should be noted that, in Examples 1 to 9, as shown in FIG. 6A, the target material 40 which contains Ga is uniformly spread over the whole of the reentrant of the sputter target, whereas in Comparative Example 1, as shown in FIG. 6B, the target material 40 is aggregated to be round, and disperses like island inside the reentrant of the sputter target to expose the backing plate surface, and as a result, Cu which constitutes the backing plate was deposited as an impurity. Indeed, when the sputter target after sputter deposition was observed, it revealed that Ga was aggregated, and as a result the backing plate surface was partially exposed. At the second deposition, spark was generated, and as a result, deposition may not be possible.

Industrial Applicability

The present invention can be applied to a backing plate for use in Ga of a sputtering apparatus and a sputtering apparatus which is used for producing a group III nitride compound semiconductor with excellent crystallinity used for producing, for example, a light emitting diode (LED), a laser diode (LD) and an electronic device.

In particular, the present invention can be applied to a backing plate for use in Ga of a sputtering apparatus and a sputtering apparatus which can be suitably used for forming a group III nitride compound semiconductor with excellent crystallinity onto a sapphire substrate.

The invention claimed is:

1. A sputtering deposition apparatus comprising a backing plate for holding a target material, wherein the target material comprises Ga in a liquid state,
    the backing plate has a contact surface coming into contact with the target material, wherein the contact surface of the backing plate is constituted from an easily wettable material having a contact angle to the Ga in a liquid state of not more than 90°,
    the easily wettable material is selected from the group consisting of silicon, carbon, silicon nitride, aluminum oxide and silicon oxide, and
    the easily wettable material does not contaminate the target material as an impurity.

2. The sputtering deposition apparatus as set forth in claim 1, wherein the backing plate including the contact surface is wholly constituted from the easily wettable material.

3. The sputtering deposition apparatus as set forth in claim 1, wherein the contact surface is constituted by coating the backing plate with the easily wettable material thereon.

4. The sputtering deposition apparatus as set forth in claim 1, which is used in depositing a layer consisting of a Group III nitride compound semiconductor including Ga on a substrate.

5. A backing plate for holding a target material for use in a sputtering deposition apparatus, wherein the target material comprises Ga in a liquid state,
    the backing plate has a contact surface coming into contact with the target material, wherein the contact surface of the backing plate is constituted from an easily wettable material having a contact angle to the Ga in a liquid state of not more than 90°,
    the easily wettable material is selected from the group consisting of a polysilicon, carbon and quartz, and
    the easily wettable material does not contaminate the target material as an impurity.

6. The backing plate for use in a sputtering deposition apparatus as set forth in claim 5, wherein the backing plate including the contact surface is wholly constituted of the easily wettable material.

7. The backing plate for use in a sputtering deposition apparatus as set forth in claim 5, wherein the contact surface is constituted by coating the backing plate with the easily wettable material thereon.

8. A sputtering deposition apparatus comprising a backing plate for holding a target material, wherein the target material comprises Ga in a solid state, and
    the backing plate has a contact surface coming into contact with the target material, wherein the contact surface of the backing plate is constituted from an easily wettable material having a contact angle to Ga in a liquid state of not more than 90°,
    the easily wettable material is selected from the group consisting of silicon, carbon, silicon nitride, aluminum oxide and silicon oxide, and
    the easily wettable material does not contaminate the target material as an impurity.

* * * * *